United States Patent
Oka et al.

(10) Patent No.: US 9,472,517 B2
(45) Date of Patent: Oct. 18, 2016

(54) DRY-REMOVABLE PROTECTIVE COATINGS

(71) Applicants: Mihir A. Oka, Chandler, AZ (US); Edward R. Prack, Phoenix, AZ (US); Dingying Xu, Chandler, AZ (US); Saikumar Jayaraman, Chandler, AZ (US)

(72) Inventors: Mihir A. Oka, Chandler, AZ (US); Edward R. Prack, Phoenix, AZ (US); Dingying Xu, Chandler, AZ (US); Saikumar Jayaraman, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 6 days.

(21) Appl. No.: 14/218,767

(22) Filed: Mar. 18, 2014

(65) Prior Publication Data
US 2015/0270235 A1    Sep. 24, 2015

(51) Int. Cl.
| H01L 21/44 | (2006.01) |
| H01L 23/00 | (2006.01) |
| H01L 21/02 | (2006.01) |
| C09D 179/04 | (2006.01) |
| C09D 181/04 | (2006.01) |
| C09D 179/08 | (2006.01) |
| C08G 73/22 | (2006.01) |

(52) U.S. Cl.
CPC ............ *H01L 24/11* (2013.01); *C08G 73/22* (2013.01); *C09D 179/04* (2013.01); *C09D 179/08* (2013.01); *C09D 181/04* (2013.01); *H01L 21/02112* (2013.01); *H01L 21/02118* (2013.01); *H01L 21/02282* (2013.01); *H01L 21/02318* (2013.01); *H01L 2224/116* (2013.01); *H01L 2224/11009* (2013.01); *H01L 2224/11849* (2013.01); *H01L 2924/095* (2013.01); *H01L 2924/12041* (2013.01); *H01L 2924/12042* (2013.01)

(58) Field of Classification Search
CPC .................. H01L 2224/116; H01L 21/02118; H01L 21/02282
USPC ........................................................ 438/612
See application file for complete search history.

(56) References Cited

U.S. PATENT DOCUMENTS

| 7,718,257 B2* | 5/2010 | Murata et al. ................ 428/354 |
| 2004/0203193 A1* | 10/2004 | Ooi et al. ...................... 438/118 |
| 2005/0054191 A1* | 3/2005 | Yu et al. ........... H01L 21/76846 438/629 |
| 2014/0057394 A1* | 2/2014 | Ramasamy et al. .... H01L 25/50 438/113 |

OTHER PUBLICATIONS

HD Microsystems, "Wet Etch Applications", Product Bulletin: PI-5878G, www.hdmicrosystems.com, revised, Sep. 2009.
Fujifilm, "Durimide® 10/32 Pre-imidized Polyamide-imide", Technical Product Information, Fujifilm Electronic Materials, www.fulifilm-ffem.com, revised, May, 2012.
Toray Industries, "List of Grade, Torelina® PPS Resin" http://www.toray.jp/plastics/en/products/torelina/grade.html, Date Unknown.

\* cited by examiner

*Primary Examiner* — Bradley K Smith
(74) *Attorney, Agent, or Firm* — Blakely, Sokoloff, Taylor & Zafman LLP

(57) ABSTRACT

Techniques are disclosed for protecting a surface using a dry-removable protective coating that does not require chemical solutions to be removed. In an embodiment, a protective layer is disposed on a surface. The protective layer is composed of one layer that adheres to the surface. The surface is then processed while the protective coating is on the surface. Thereafter, the protective layer is removed from the surface by separating the protective layer away from the surface without the use of chemical solutions.

16 Claims, 8 Drawing Sheets

DRY-REMOVABLE PROTECTIVE COATINGS

TECHNICAL FIELD

Embodiments of the present invention relate generally to protective coatings used in the manufacture of semiconductor devices. More particularly, embodiments of the present invention relate to dry-removable protective coatings used in the manufacture of solder bumps for a semiconductor device.

BACKGROUND

An increasing demand for modern mobile electronic products such as smartphones, tablets, and laptop/notebooks has reciprocated a strong demand for the production of microelectronic devices that operate them. To match this demand, microelectronic device manufacturers have increased production and invested time and money in developing techniques for cost-effective fabrication processes. General fabrication processes for constructing a microelectronic device include depositing and etching a material in a reiterative fashion and forming bonding structures on the microelectronic device. Protective coatings may be used in the fabrication of both the microelectronic device and the bonding structures. Typical resist materials that form the protective coatings are highly adhesive to the underlying layer in order to prevent shifting and/or separation during processing. Furthermore, some resist materials may even chemically react and form strong physical bonds with the underlying layer. As such, current removal techniques use wet removal processes with wet etchants to remove the resist materials. The wet etchants include chemicals that can be toxic and/or corrosive, e.g., strongly oxidizing acids, and can be expensive to obtain and dispose. Furthermore, wet etchants are harmful to the environment and can cause environmental contamination.

DETAILED DESCRIPTION

Dry-removable protective coatings for semiconductor devices are disclosed. Embodiments of the present invention are described with respect to specific details in order to provide a thorough understanding of the invention. One of ordinary skill in the art will appreciate that embodiments of the invention can be practiced without these specific details. In other instances, well known semiconductor processes and equipment are not described in specific detail in order to not unnecessarily obscure embodiments of the present invention. Additionally, the various embodiments shown in the figures are illustrative representations and are not necessarily drawn to scale.

Embodiments of the invention are directed to dry-removable protective coatings for semiconductor devices. A dry-removable protective coating is formed on a substrate and then removed by physical separation such as peeling. Chemicals are not used to remove the dry-removable protective coating from the substrate.

In one embodiment of the invention, a wafer having a plurality of dies each having a plurality of contacts is provided. An encapsulant layer is initially formed around the contacts and on a top surface of each of the dies. A dry-removable protective coating is then deposited on the contacts and on the encapsulant layer. Thereafter, openings are formed within the protective coating to expose the contacts. A solder paste is then deposited within the openings and on top of the contacts. The solder paste is then reflowed to form solder bumps disposed directly on the contacts. The dry-removable protective coating is then removed from the wafer by physical separation such as peeling. Stripping chemicals are not used to physically separate the dry-removable protective coating. Thereafter, the solder bumps remain on the contacts.

Figure 1A:
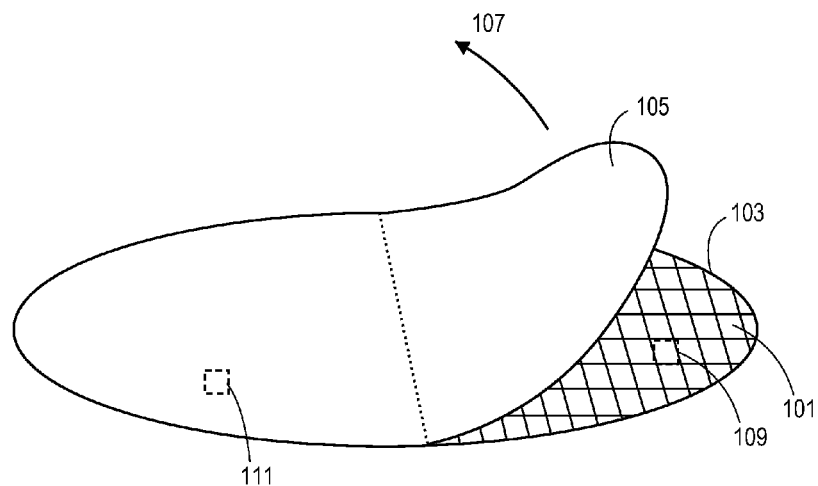
FIGS. 1A-1C illustrate perspective and isometric views of removing a dry-removable protective coating from a wafer in accordance with an embodiment of the invention.
Figures 1B, 1C:
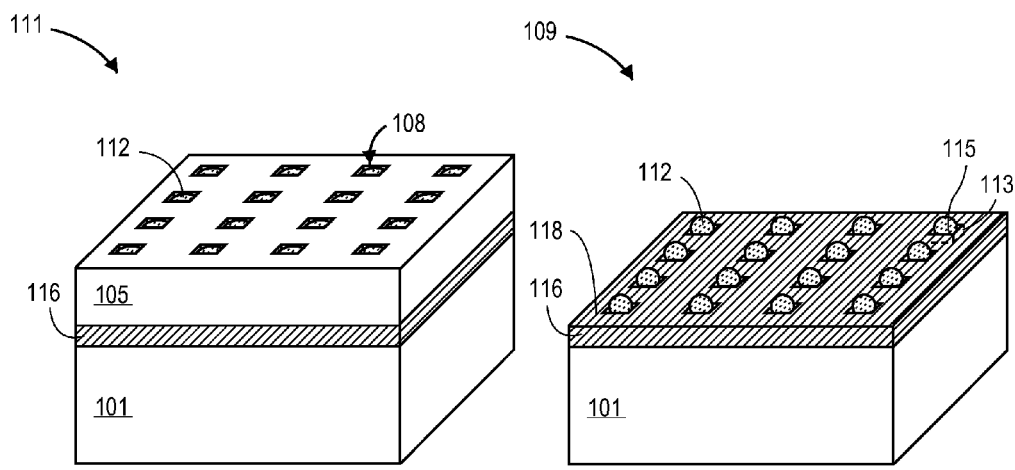

FIGS. 1A-1C illustrate perspective and isometric views of removing a dry-removable protective coating from a substrate, such as a wafer, in accordance with an embodiment of the invention. With reference to FIG. 1A, a perspective view of removing a dry-removable protective coating 105 from a wafer 103 is illustrated, according to an embodiment of the invention. A plurality of dies 101 formed on a wafer 103 is covered by a dry-removable protective coating 105. In embodiments, the dry-removable protective coating 105 is used to protect the dies 101 from process conditions applied to the wafer 103. As such, the dry-removable protective coating 105 is resistant to high temperatures as well as common wet and dry processing chemicals, such as hydrocarbons, esters, ethers, and alcohols. In an embodiment, as shown in FIG. 1A, the dry-removable protective coating 105 is removed from the wafer 103 by physical separation, such as peeling. As such, no stripping chemicals or etchants are required to remove the dry-removable protective coating 105 from the wafer 103. As depicted in FIG. 1A, the dry-removable protective coating 105 is peeled off the wafer 103 by a force 107 directed away from the wafer 103. In an embodiment, an adhesiveness of the dry-removable coating 105 is weak enough to enable peeling of the coating 105 off of the wafer 103. Furthermore, in an embodiment, a tensile strength of the dry-removable coating 105 is high enough to resist shearing and/or tearing when the force 107 is applied during peeling. As such, the dry-removable protective coating 105, according to embodiments of the invention, make peeling a practical method of removal. A covered die 111 is located in an area of the wafer that has not yet been peeled and an uncovered die 109 is located in an area of the wafer that has already been peeled. The two dies are shown in more detail in FIGS. 1B and 1C below.

As illustrated in FIG. 1B, a covered die 111 covered with a layer of the dry-removable protective coating 105 is illustrated according to an embodiment of the invention. The covered die 111 includes a die 101, an encapsulant layer 116 formed on top of the die 101, and the dry-removable protective coating 105 disposed on top of the encapsulant layer 116. In an embodiment, the dry-removable protective coating 105 is adhered to the encapsulant layer 116 without a separate adhesive layer. Solder bumps 112 are contained in openings 108 formed within the dry-removable protective coating 105. As such, the solder bumps 112 are surrounded by the dry-removable protective coating 105.

Referring now to FIG. 1C, an uncovered die 109 after the dry-removable protective coating 105 has been peeled is illustrated according to an embodiment of the invention. The uncovered die 109 includes a die 101, an encapsulant layer 116 having a top surface 118, contacts 113 having top surfaces 115, and solder bumps 112 disposed on the top surfaces 115 of the contacts 113. The dry-removable protective coating 105 has been removed from the top surface 118 of the encapsulant layer 116 by peeling and thus is not shown in FIG. 1C. In an embodiment, because no glue or adhesive is used, substantially little residue of the dry-removable protective coating 105 is left on the top surface 118 of the encapsulant layer 116. The solder bumps 112 remain on the top surfaces 115 of the contacts 113 to attach and electrically couple external devices (not shown) with the die 101.

Figure 2A:
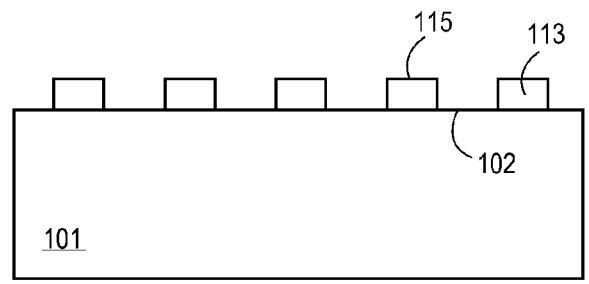
FIGS. 2A-2I illustrate cross-sectional views of forming solder bumps on a die with a dry-removable protective coating in accordance with an embodiment of the invention.

FIGS. 2A-2I illustrate methods of forming solder bumps on a die with a dry-removable protective coating in accordance with an embodiment of the invention. As shown in FIG. 2A, a die 101 having contacts 113 on a top surface 102 of the die 101 is provided. The die 101 may be one of many dies on a substrate, such as a wafer (shown in FIG. 1A) or a package substrate, that contains a plurality of dies. In an embodiment, the die 101 is a microelectronic device that is constructed from a bulk monocrystalline semiconductor substrate, on top of which are semiconductor devices, then metal interconnect layers electrically coupled to the semiconductor devices, a passivation layer disposed over the metal interconnect layers, and finally, contacts 113 exposed in openings in the passivation layer and electrically coupled to the metal interconnect layers. The die 101 may be any device such as, but not limited to, a microprocessor, a chipset, a graphics device, a wireless device, a multi-chip device, and a memory device. As shown in FIG. 2A, the contacts 113 have top surfaces 115 upon which solder bumps may form. The contacts 113 may be formed from any suitable conductive material such as, but not limited to, copper, aluminum, and alloys thereof. In an embodiment, the contacts 113 are bond pads, such as conventional aluminum or copper bond pads, or bump pads, such as copper bumps or copper pillars. The contacts 113 may be formed by any suitable method well known in the art.

Figure 2B:
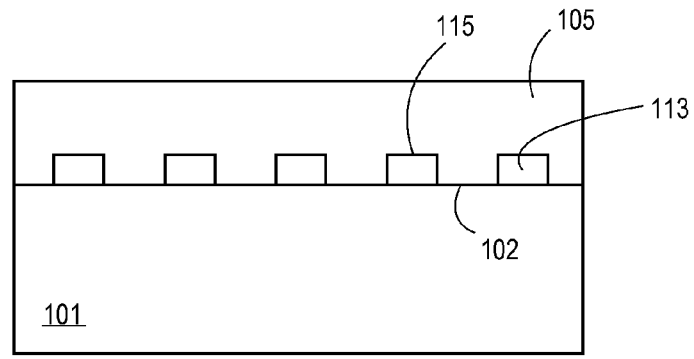

Next, in FIG. 2B, a dry-removable protective coating 105 is disposed on the top surface 102 of the die 101 and the top surface 115 of the contacts 113 by any suitable wet or dry deposition technique. For instance, in an embodiment, the coating 105 is liquid coated by spinning onto the die 101. In an alternative embodiment, the protective coating 105 is molded or laminated onto the die 101. The dry-removable protective coating 105 may be deposited to have a thickness sufficient to protect the die 101 from process conditions. In an embodiment, a wafer photoresist layer is disposed between the top surface 102 of the die 101 and the dry-removable coating 105 such that the coating 105 is disposed on the wafer photoresist layer. The wafer photoresist layer may serve as a buffer layer in between the die 101 and the dry-removable protective coating 105. In an embodiment, the dry-removable protective coating 105 has a thickness in the range of 30 to 100 um In embodiments, the dry-removable protective coating 105 includes a base resin for serving as a binder or matrix. In an embodiment, the base resin is a spin-on dielectric. In a particular embodiment, the base resin is any passivation stress buffer (PSB) material such as polybenzoxazole (PBO). In another embodiment, the base resin is a liquid crystal polymer (LCP). Furthermore, in an alternative embodiment, the base resin is polynorbornenes (PNB). Alternatively, in an embodiment, the base resin is polyphenylene sulfide (PPS). In another embodiment, the passivation base resin is benzocylcobutene (BCB). In an additional embodiment, the base resin is polyimide (PI). In one specific embodiment, the base resin is a material, such as PI-5878 from HD MicroSystems™, formulated without adhesion promoters. In an embodiment, the base resin has a post-cure tensile strength of at least 20 MPa. Using a base resin without adhesion promoters allows customization of the adhesive properties of the dry-removable protective coating 105. As such, a specific amount of adhesion promoters may be added into the base resin to achieve a target adhesive strength. In an embodiment, the target adhesive strength of the dry-removable protective coating 105 is low enough for the dry-removable protective coating 105 to be peeled from the die 101 yet strong enough to remain adhered to the die 101 during process conditions. For instance, following wet deposition and before curing, the dry-removable protective coating 105 may have a target adhesive strength in the range of 500 mN/20 mm to 9000 mN/20 mm when adhered to a wafer, such as a silicon wafer. Following curing, however, the dry-removable protective coating 105 may have a lower target adhesive strength, such as 50 mN/20 mm to 400 mN/20 mm when adhered to a wafer, due to an increase in the cross-linking density of the dry removable protective coating.

As briefly mentioned above, various additives may be included in the base resin of the dry-removable protective coating 105 to enable removal by peeling. In an embodiment, elastomers are added into the base resin to form a tougher, more structurally resilient dry-removable protective coating 105. Exemplary elastomers include, but are not limited to, rubbers such as butadiene and acrylonitrile copolymers, and thermoplastic agents such as poly(ether imide), poly(ether ketone), and poly(ether sulfone). Toughness of the dry-removable protective coating 105 prevents splitting and/or shearing during the dry removal process. Additionally, rigid particle fillers may be added into the base resin to control viscosity, modulate UV absorbance, or control structural rigidity. In an embodiment, the filler additive may include any suitable micron-sized or nanometer-sized materials such as, but not limited to, silicon dioxide, titanium dioxide, graphite powder, carbon black, quantum dots, diamond powder, metal fibers, ceramic fibers, silica, and silicon carbide. The addition of fillers creates a stronger, more dense and viscous material. Furthermore, the dry-removable protective coating 105 may turn photosensitive by including a photo pack additive into the base resin. In an embodiment, the photo pack additive is a negative tone photo pack additive such that the coating 105 cross-links after exposure to electromagnetic radiation, such as white or ultraviolet (UV) light. As such, the dry-removable protective coating 105 may be cured by exposure to electromagnetic radiation rather than be cured by exposure to heat. Furthermore, the addition of a negative tone photo pack additive avoids the need for photoresist, which may minimize stray light effect typically experienced with the use of photoresist.

Figure 2C:
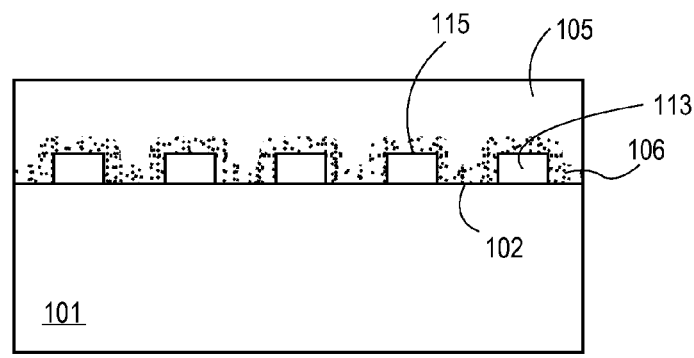

Optionally, as shown FIG. 2C, loosening additives 106 may be included into the base resin of the dry-removable protective coating 105 to decrease the intrinsic adhesive properties found in conventional commercially produced base resins. In embodiments, the loosening additives 106 are included in the formulation of the dry-removable protective coating 105 and do not form a separate layer. As such, the dry-removable protective coating 105 is a single layer that adheres to the die 101 without a separate adhesive layer. In an embodiment, the loosening additives 106 are low molecular weight monomeric surfactants, such as fluorosurfactants and siloxanes. The monomeric surfactants diffuse to the interface between the dry-removable protective coating 105 and the contacts 113 and the top surface 102 of the die 101. Diffusion of the monomeric surfactants to the interface is caused primarily by thermal motion. The diffusion is energetically favored because the surfactant molecule can assume more numbers of conformations and orientations at the surface as opposed to in the bulk material. After diffusion, monomeric surfactants reduce the coefficient of friction at the interface, thereby lowering the adhesion of the dry-removable protective coating 105 with the top surface 102 of the die 101 and the contacts 113. In an embodiment, the amount of monomeric surfactants included in the base resin is adjusted to achieve the target adhesion strength of the dry-removable protective coating 105 mentioned above. It is to be appreciated that loosening additives 106 are optional and need not be included in embodiments of the invention, as is shown by its absence in the following figures.

Figure 2D:
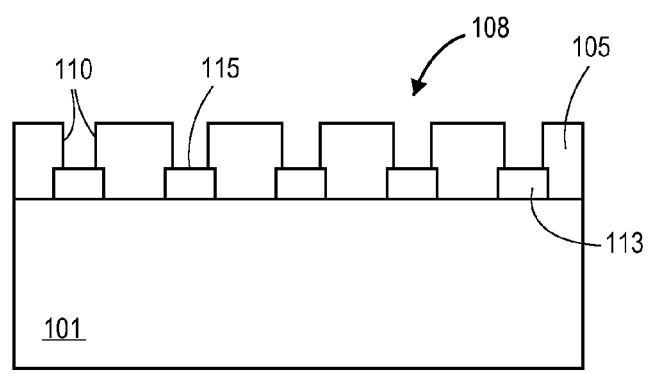

Thereafter, as illustrated in FIG. 2D, openings 108 are formed in the dry-removable protective coating 105 to expose the top surfaces 115 of the contacts 113. FIG. 2D shows openings 108 formed for every contact 113, but alternative embodiments are not so limited. In an embodiment, the openings 108 have substantially vertical opening sidewalls 110 that form an opening 108 narrower than the width of each contact 113. Accordingly, outer portions of the contacts 113 may be covered by the protective coating 105. The openings 108 allow interconnect structures, such as solder bumps, to form on the contacts 113. Techniques for forming the openings 108 include laser ablation with a 308 nm laser emitting through a patterned mask or any other typical mask and etch process. In an embodiment, a curing process to drive out solvents within the dry-removable protective coating 105 is performed after depositing the dry-removable protective coating 105 and before forming the openings 108. Alternatively, in an embodiment, a curing process is performed after forming the openings 108. In an embodiment, the curing temperature is below 250° C.

Figure 2E:
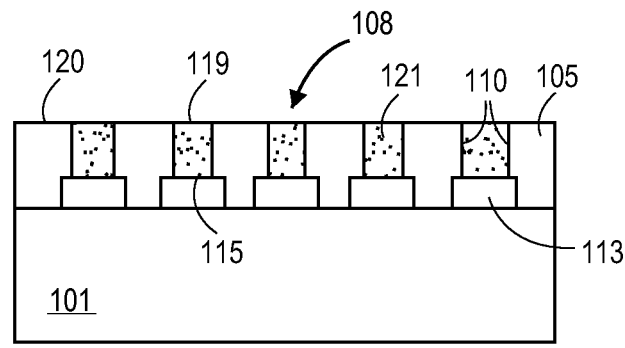

Next, in FIG. 2E, a solder paste 121 is formed within the openings 108 and directly on the top surface 115 of the contacts 113. In some embodiments, the solder paste 121 is formed of relatively small sized micro-balls of solder powder in a flux matrix. In some embodiments, the solder powder has a diameter that is one-seventh or less of the smallest feature size, which is typically the opening 108 width or depth. The solder paste 121 may be formed of any suitable solder materials, including but not limited to, silver/tin alloys and alloys with a high tin content (e.g., 90% or more tin). Although embodiments deposit a solder paste 121, other embodiments are not so limited. In an embodiment, the solder paste 121 completely fills in the openings 108 such that the top surface 119 of the solder paste 121 is substantially planar to the top surface 120 of the dry-removable protective coating 105. Sidewalls 110 contain the solder paste 121 over the contacts 113 and prevent solder paste 121 from spilling onto the top surface 102 of the die 101 and shorting adjacent contacts 113. In an embodiment, the solder paste 121 may be deposited within the openings 108 by any deposition or printing process well known in the art, such as solder paste printing or squeegee printing. In a particular embodiment, the solder paste 121 is squeegee printed into the openings 108 using the dry-removable protective coating 105 as a stencil.

Figure 2F:
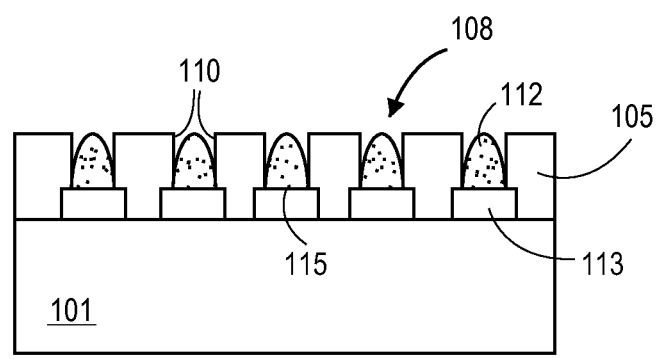

In FIG. 2F, the solder paste 121 is reflowed to form solder bumps 112 within the openings 108 and directly on the top surfaces 115 of the contacts 113. The sidewalls 110 of the dry-removable protective coating 105 confine the solder paste 121 above the contacts 113 during reflow to prevent liquidized solder from spilling onto the top surface 102 of the die 101 and shorting adjacent contacts 113. The size and shape of the solder bumps 112 depend on the dimensions of the opening 108. Generally, wider openings 108 form larger solder bumps 112 and narrower openings 108 form smaller solder bumps 112. However, narrower openings 108 better prevent liquidized solder from spilling onto the top surface 102 of the die 101 and shorting adjacent contacts 113 by providing a thicker barrier. As such, an opening width that achieves a desired balance between solder bump size and production yield may be utilized in embodiments of the present invention. Once cooled, the reflowed solder paste 121 solidifies into solder bumps 112. Any suitable heating technique well known in the art may be used to reflow the solder paste 121. In an embodiment, the reflow process is performed at a temperature in the range of 250 to 270° C. As such, in an embodiment, the dry-removable protective coating 105 is resistant to temperatures greater than 270° C. to prevent film degradation during the reflow process. In alternative embodiments where a reflow process is not used, the dry-removable protective coating 105 is resistant to temperatures greater than 120° C.

Figure 2G:
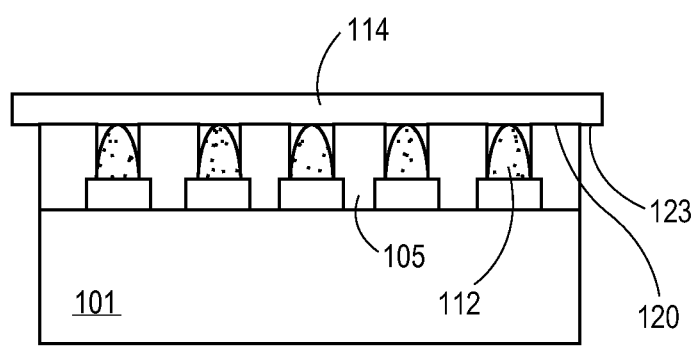

Next, the dry-removable protective coating 105 is removed. In an embodiment, as illustrated in FIG. 2G, a peel tape 114 is placed on the top surface 120 of the dry-removable protective coating 105. The peel tape 114 may be formed of a polyester base material with one or more adhesive layers on at least the bottom surface 123 of the peel tape 114. In an embodiment, the adhesive strength of the peel tape 114 is greater than the adhesive strength of the dry-removable protective coating 105. As such, the bond between the peel tape 114 and the coating 105 is stronger than the bond between the coating 105 and the top surface 102 of the die 101 and the contacts 113. Therefore, the peel tape may remove the coating 105 from the die 101 without prematurely separating from the coating 105. In an embodiment, the adhesive strength of the peel tape 114 ranges from 2500 mN/20 mm to 7300 mN/20 mm. In an embodiment, placement of the peel tape 114 may be performed by hand, machine, or any other suitable film placement technique.

Figure 2H:
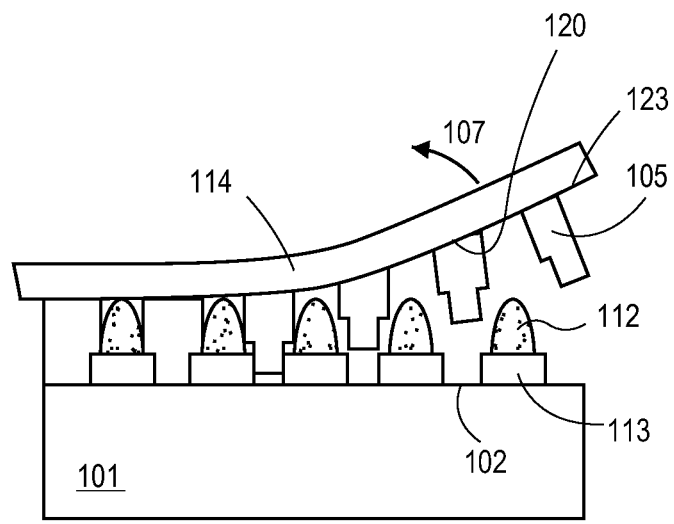

In FIG. 2H, the dry-removable protective coating 105 is peeled off of the top surface 102 of the die 101 and the contacts 113. In an embodiment, physical force removes the dry-removable protective coating 105 without the use of stripping chemicals. As shown in FIG. 2H, the dry-removable protective coating 105 is peeled off with a force 107 directed away from the die 101. The peel tape 114 may be used for better grip and/or leverage during peeling. It is to be appreciated that use of the peel tape 114 is optional as the dry-removable protective coating 105 can be removed without the peel tape 114. Properties of the coating 105, such as high toughness and low adhesiveness allow the dry-removable protective coating 105 to be peeled off the die 101 with or without a peel tape 114. Structural toughness, as defined by tensile strength, prevents shearing and/or tearing of the coating 105 during peeling. In an embodiment, the dry-removable protective coating 105 has a tensile strength in the range of 150 to 400 MPa. Moreover, low adhesiveness enables the coating 105 to be peeled from the die 101. As such, in an embodiment, the dry-removable protective coating 105 is peeled from the die 101 without a peel tape 114. In an embodiment, the dry-removable protective coating 105 is removed by vacuuming the coating 105 off of the die 101. Alternatively, in an embodiment, the dry-removable protective coating 105 is blown off the die 101 with highly pressurized air. In an alternative embodiment, the dry-removable protective coating 105 is removed by a dry removal process, such as a plasma etch process.

Figure 2I:
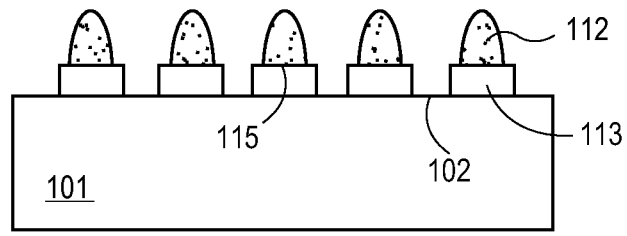

In FIG. 2I, solder bumps 112 remain on the top surface 115 of the contacts 113. The dry-removable protective coating 105 is not shown because it has been completely removed from the top surface 102 of the die 101 and the top surfaces 115 of the contacts 113. In an embodiment, the high tensile strength and the low adhesive properties of the coating 105 cause the coating 105 to leave substantially little residue on the exposed surfaces 102 and 115. The solder bumps 112 may be contained above the contacts 113 as a result of being confined within the sidewalls 110 of the openings 108 during solder reflow. In an embodiment, the solder bumps 112 are to be used for attaching and making electrical connection with external microelectronic devices.

Figure 3A:
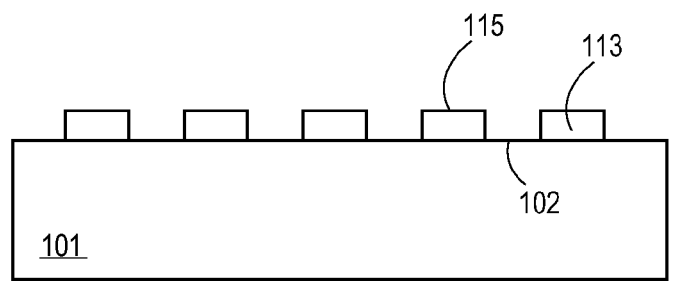
FIGS. 3A-3K illustrate cross-sectional views of forming solder bumps on a die with an encapsulant layer using a dry-removable protective coating in accordance with an embodiment of the invention.

FIGS. 3A-3K illustrate methods of forming solder bumps on a die with an encapsulant using a dry-removable protective coating in accordance with an embodiment of the invention. As shown in FIG. 3A, a die 101 having contacts 113 on a top surface 102 of the die 101 is provided. The die 101 may be one of many dies on a substrate containing a plurality of dies, such as a wafer (shown in FIG. 1A) or a package substrate. In an embodiment, the die 101 is a microelectronic device substantially similar to the chip described in FIG. 2A above. The contacts 113, constructed of a material discussed above, have top surfaces 115 upon which solder bumps may form. Methods of forming the contacts 113 include a single damascene process and a sputter and etch process.

Figure 3B:
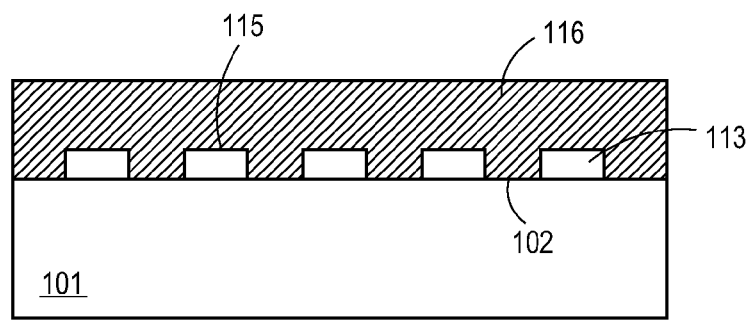

Next, in FIG. 3B, an encapsulant layer 116 is deposited over the top surface 102 of the die 101 and the contacts 113 by any suitable deposition process, such as a spin-on process. In an embodiment, the encapsulant layer 116 is a layer, such as but not limited to, an underfill layer, a wafer level underfill layer, and a mold. The encapsulant layer is a structural support layer that exhibits low modulus, low coefficient of thermal expansion (CTE), low moisture absorption, and good adhesion to the die 101. The encapsulant layer 116 may be formed of any suitable material such as an epoxy resin. In an embodiment, the encapsulant layer material contains a high amount of silicon dioxide filler to achieve the desired viscosity during deposition. A curing process is performed following deposition of the encapsulant layer 116 to drive out solvents and to form a solid structure. In an embodiment, a wafer photoresist layer is disposed between the top surface 102 of the die 101 and the encapsulant layer 116 such that the encapsulant layer 116 is disposed on the wafer photoresist layer. The wafer photosensitive layer may serve as a buffer layer in between the die 101 and the encapsulant layer 116.

Figure 3C:
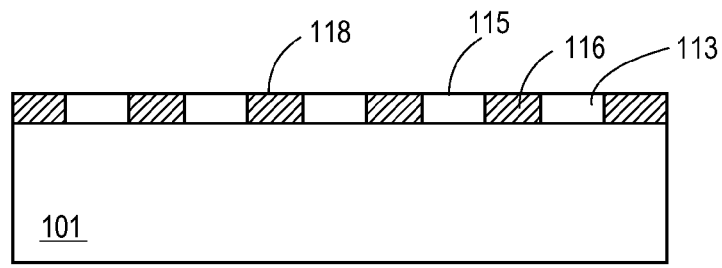

Thereafter, in FIG. 3C, the encapsulant layer 116 is planarized. In an embodiment, the encapsulant layer 116 is planarized to the top surface 115 of the contacts 113. As such, the top surface 118 of the encapsulant layer 116 is substantially planar to the top surface 115 of the contacts 113. In an embodiment, the encapsulant layer 116 surrounds the contacts 113. The encapsulant layer 116 may provide structural support for the contacts 113 during thermal expansion. Planarization may be performed by any suitable planarization technique, such as chemical-mechanical polishing (CMP). Following planarization, in an embodiment, the top surface 118 of the encapsulant layer 116 has an increased surface roughness caused by the abrasiveness of the CMP process.

Figure 3D:
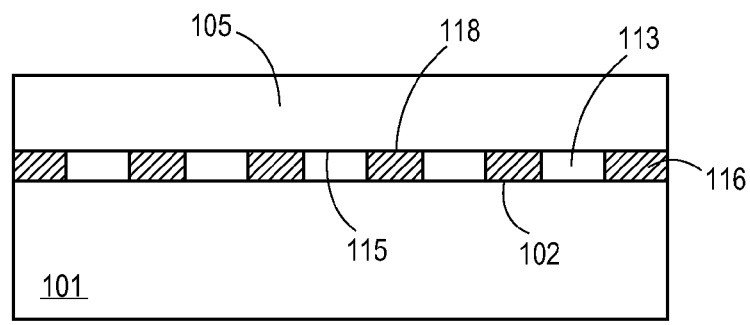

In FIG. 3D, a dry-removable protective coating 105 is disposed on the top surface 118 of the encapsulant layer 116 and the top surfaces 115 of the contacts 113 by any suitable wet or dry deposition technique, such as a spin on or a lamination process as discussed above. Additionally, the dry-removable protective coating 105 may be formed with a thickness sufficient to protect the die 101 from process conditions, such as, in an embodiment, a thickness in the range of 30 to 100 µm. The dry-removable protective coating 105 may be formed from any material discussed above and any material having the properties discussed above.

A strong bond may be formed between the dry-removable protective coating 105 and the encapsulant layer 116 due to chemical reactions between the dry-removable protective coating 105 and the silicon dioxide filler inside the encapsulant layer 116. Additionally, the surface roughness of the planarized encapsulant layer 116 may lead to mechanical interlocking between the encapsulant layer 116 and the dry-removable protective coating 105. As such, the dry-removable protective coating 105 may be strongly adhered to the encapsulant layer 116. To counter such strong adhesion, the dry-removable coating 105 may be formed from a base resin that includes loosening additives 106 as shown in FIG. 3E.

Figure 3E:
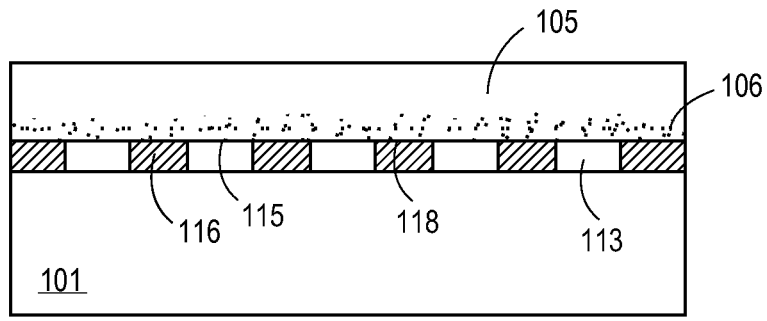

As illustrated in FIG. 3E, loosening additives 106 are included into the base resin of the dry-removable protective coating 105 to decrease the intrinsic adhesive properties found in conventional commercially produced base resins. In embodiments, the loosening additives 106 are included in the formulation of the dry-removable protective coating 105 and do not form a separate layer. As such, the dry-removable protective coating 105 is a single layer that adheres to the encapsulant layer 116 and the contacts 113 without a separate adhesive layer. In an embodiment, the loosening additives 106 include low molecular weight monomeric surfactants, such as fluorosurfactants and siloxanes. Once the dry-removable coating 105 is deposited, the monomeric surfactants diffuse to the interface between the dry-removable protective coating 105 and both the contacts 113 and the encapsulant layer 116. Once there, the monomeric surfactants reduce the coefficient of friction at the interface by disrupting the physical bonds between the silicon dioxide filler and the coating 105. The reduction of friction mitigates the adhesive-strengthening effects caused by the surface roughness from the planarization process and the physical bonds from the chemical reaction with silicon dioxide fillers. As such, the adhesion of the dry-removable protective coating 105 to the contacts 113 and the encapsulant layer 116 is reduced. In an embodiment, the amount of monomeric surfactants included in the base resin is adjusted to achieve the target adhesion strength mentioned above.

Figure 3F:
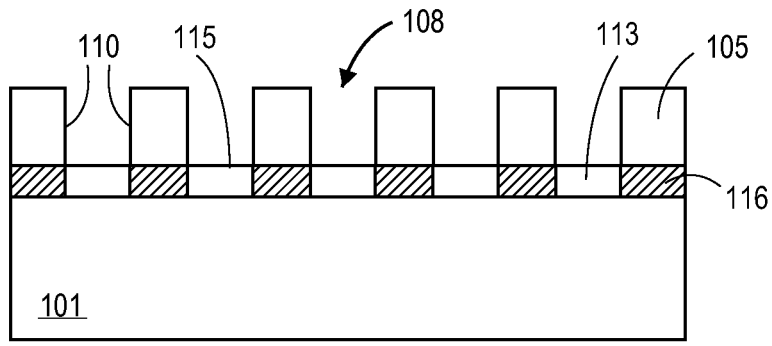

Next, in FIG. 3F, openings 108 are formed in the dry-removable protective coating 105 to expose the top surface 115 of the contacts 113. Openings 108 do not need to be formed for every contact 113 despite the illustration in FIG. 3F. In an embodiment, the openings 108 and the contacts 113 have equal widths. In an alternative embodiment, the openings 108 are narrower than the contacts 113 such that outer portions of the contacts 113 are covered by the protective coating 105. The openings 108 allow interconnect structures, such as solder bumps, to form on the contacts 113. The openings 108 may be formed by laser ablation with a patterned mask or any other typical mask and etch processes.

In an embodiment, a curing process to drive out solvents within the dry-removable protective coating 105 is performed after depositing the dry-removable protective coating 105 and before forming the openings 108. Alternatively, in an embodiment, a curing process is performed after forming the openings 108. In an embodiment, the curing temperature is below 250° C.

Figure 3G:
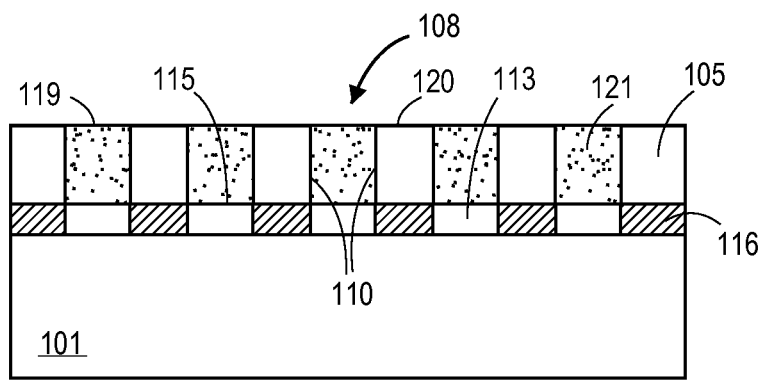

In FIG. 3G, a solder paste 121 is formed within the openings 108 and directly on the top surface 115 of the contacts 113. The solder paste may be formed from any suitable solder materials discussed above. In an embodiment, the solder paste 121 completely fills in the opening 108 such that the top surface 119 of the solder paste 121 is substantially planar to the top surface 120 of the dry-removable protective coating 105. Sidewalls 110 contain the solder paste 121 over the contacts 113 and prevent solder paste 121 from spilling onto the top surface 102 of the die 101 and shorting adjacent contacts 113. In an embodiment, the solder paste 121 may be deposited within the openings by any suitable deposition or printing process well known in the art. In a particular embodiment, the solder paste 121 is solder paste printed into the openings 108 by using the dry-removable protective coating 105 as a stencil.

Figure 3H:
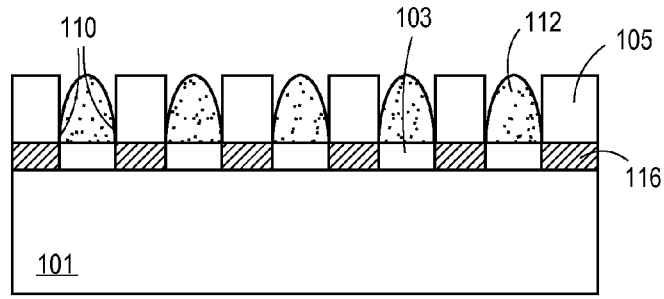

Next, in FIG. 3H, the solder paste 121 is reflowed to form solder bumps 112 within the openings 108 and directly on the top surfaces 115 of the contacts 113. The sidewalls 110 of the dry-removable protective coating 105 confine the solder paste 121 above the contacts 113 during reflow to prevent liquidized solder from spilling onto the encapsulant layer 116. Once cooled, the reflowed solder paste 121 solidifies into the solder bumps 112. Any suitable heating technique well known in the art may be used to reflow the solder paste 121.

Figure 3I:
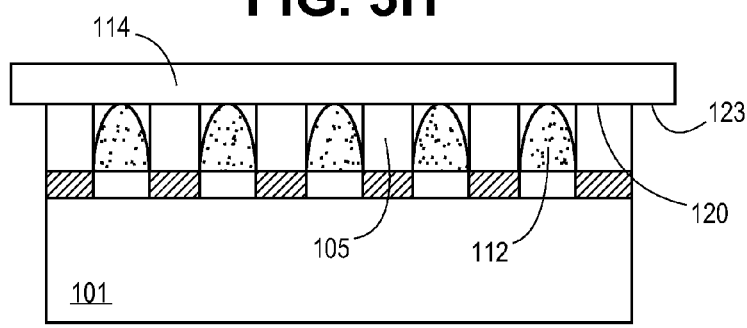

Next, the dry-removable protective coating 105 is removed. In an embodiment, as illustrated in FIG. 3I, a peel tape 114 is placed on the top surface 120 of the dry-removable protective coating 105. The peel tape 114 may be formed of a polyester base material with one or more adhesive layers on at least the bottom surface 123 of the peel tape 114. In an embodiment, the adhesive strength of the peel tape 114 is greater than the adhesive strength of the dry-removable protective coating 105. As such, the bond between the peel tape 114 and the coating 105 is stronger than the bond between the coating 105 and the die 101. Therefore, the peel tape may remove the coating 105 from the top surface 118 of the encapsulant layer 116 and the contacts 113 without separating from the coating 105.

Figure 3J:
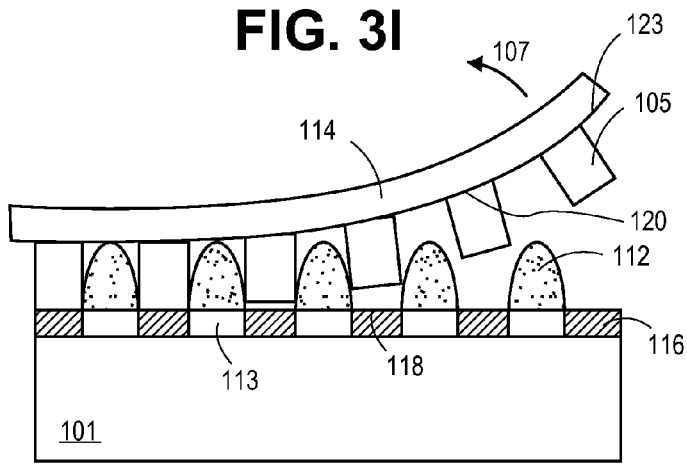

Thereafter, as illustrated in FIG. 3J, the dry-removable protective coating 105 is peeled off of the top surface 118 of the encapsulant layer 116 and the contacts 113. In an embodiment, physical force removes the dry-removable protective coating 105 without the use of stripping chemicals. As shown in FIG. 3J, the dry-removable protective coating 105 is peeled off with a force 107 directed away from the top surface 118 of the encapuslant layer 116 and the contacts 113. The peel tape 114 may be used for better grip and/or leverage during peeling. It is to be appreciated that use of the peel tape 114 is optional as the dry-removable protective coating 105 can be removed without the peel tape 114. Properties of the coating 105, such as high toughness and low adhesiveness allow the dry-removable protective coating 105 to be peeled off the die 101 with or without a peel tape 114. Structural toughness prevents shearing and/or tearing of the coating 105 during peeling. Moreover, low adhesiveness enables the coating 105 to be peeled from the die 101. As such, in an embodiment, the dry-removable protective coating 105 is peeled from the die 101 without a peel tape 114.

Figure 3K:
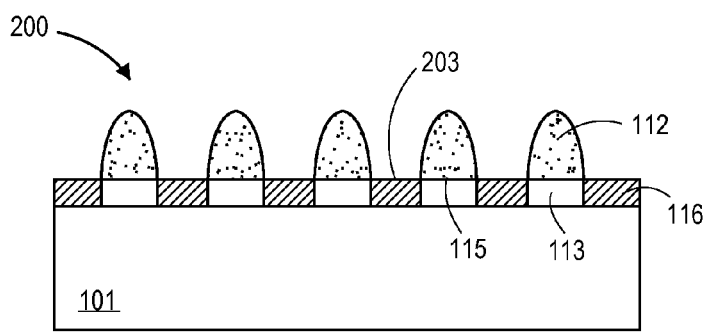

Next, in FIG. 3K, the dry-removable protective coating 105 has been completely removed from the top surface 118 of the encapsulant layer 116 and the top surfaces 115 of the contacts 113. In an embodiment, the high tensile strength and low adhesive properties of the coating 105 cause the coating 105 to leave substantially little residue on the exposed surfaces 118 and 115. The solder bumps 112 may be contained above the contacts 113 as a result of being confined within the sidewalls 110 of the openings 108 during solder reflow. In an embodiment, the solder bumps 112 are to be used for attaching and making electrical connection with external microelectronic devices.

Applications of the dry-removable protective coating 105 are not limited to the embodiments depicted in FIGS. 2 and 3. For example, the dry-removable protective coating 105 may be used in integrated circuit (IC) processing, IC packaging, light emitting diode (LED) processing, microelectromechanical (MEM) device processing, and solar photonics processing. In an embodiment, the dry-removable protective coating 105 is used on a package substrate for protection. Alternatively, in an embodiment, the dry-removable protective coating 105 is used on a panel of package substrates which has a dimension of a certain width and length. Furthermore, the dry-removable coating 105 can be also used to hold two wafers together for carrying. Essentially, any process that requires a layer or a surface to be protected with a protective layer can utilize embodiments of the present invention. Using the dry-removable protective coating 105 in lieu of conventional PSB materials saves cost as well as prevents damage to the environment because expensive and highly caustic substances are not used to remove the protective coating 105.

Figure 4:
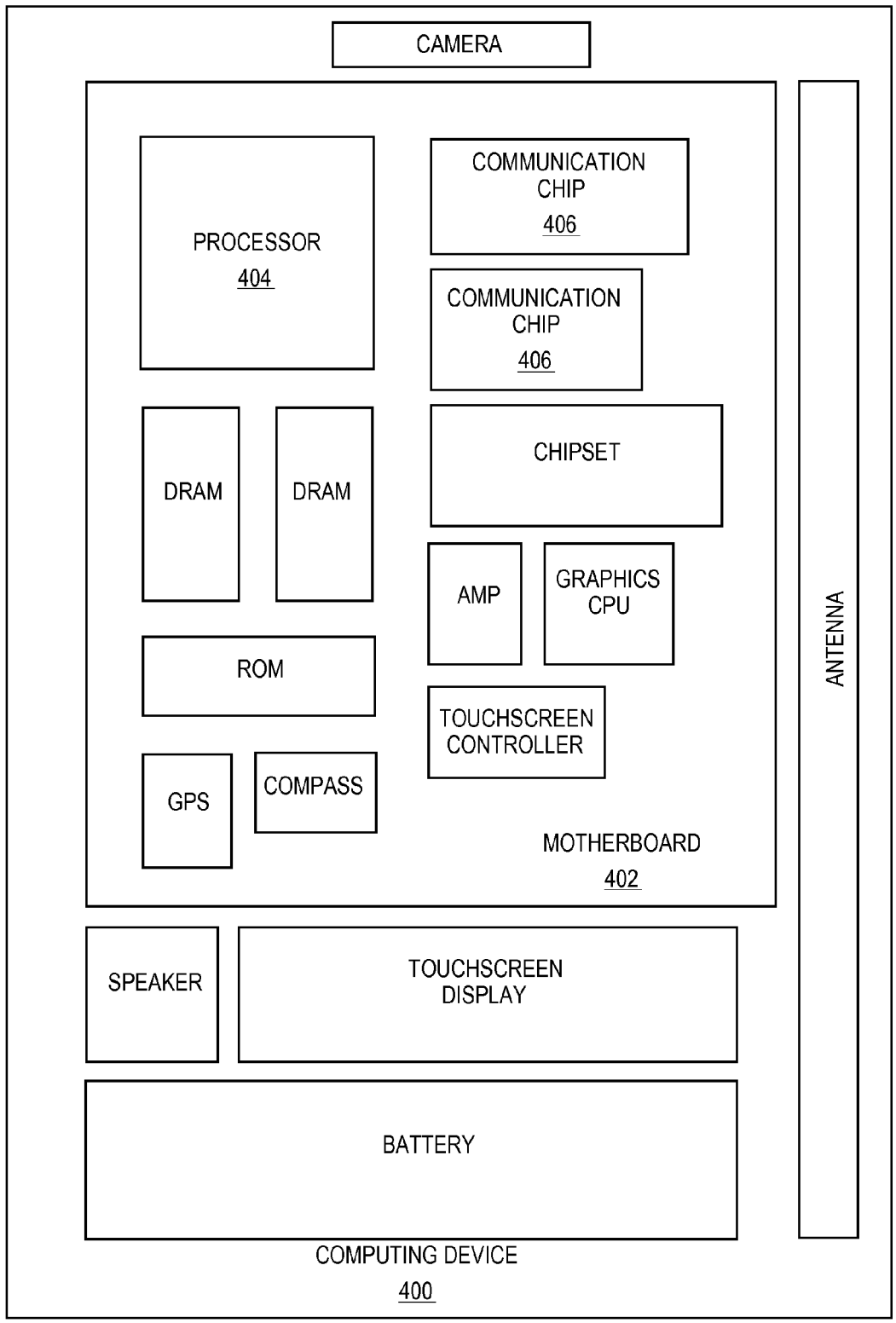
FIG. 4 illustrates a computing system implemented with one implementation of the invention.

FIG. 4 illustrates a computing system 400 implemented with one implementation of the invention. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. In some implementations of the invention, the integrated circuit die of the processor has been fabricated with methods utilizing dry-removable protective coatings. The term "processor" may refer to any device or portion of a device that processes electronic data from registers and/or memory to transform that electronic data into other electronic data that may be stored in registers and/or memory.

The communication chip 406 also includes an integrated circuit die packaged within the communication chip 406. In accordance with another implementation of the invention, the integrated circuit die of the communication chip includes one or more devices that are formed using dry-removable protective coatings in accordance with implementations of the invention.

In further implementations, another component housed within the computing device 400 may contain an integrated circuit die that includes one or more devices that are formed with dry-removable protective coatings in accordance with implementations of the invention.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

In an embodiment, a method of protecting a surface comprises disposing a protective coating on a surface of a substrate, the protective coating is composed of one layer that adheres to the surface; processing the surface while the protective coating is on the surface; and removing the protective coating from the surface by separating the protective coating off of the surface without the use of chemical solutions. In an embodiment, separating the protective coating is performed by peeling. Additionally, in an embodiment, the protective coating is resistant to temperatures greater than 120° C. Furthermore, in an embodiment, the protective coating comprises an additive. Moreover, the additive is a monomeric surfactant. In an embodiment, the monomeric surfactant is a material selected from the group consisting of fluorosurfactants and siloxanes. In an embodiment, disposing the protective coating comprises spinning on a wet solution. Additionally, in an embodiment, disposing the protective coating further comprises curing the wet solution. Moreover, in an embodiment, the surface is a top surface of a wafer. Furthermore, in an embodiment, the wafer comprises a plurality of dies.

In an embodiment, a method of forming a structure on a semiconductor device comprises disposing a protective coating on a wafer, the protective coating is composed of one layer that adheres to the wafer; patterning openings within the protective coating that expose contacts on the wafer; disposing solder within the openings; and removing the protective coating from the wafer by separating the protective coating away from the wafer without the use of a chemical solution, leaving the material to remain as a patterned structure. Additionally, removing the protective coating is performed after disposing solder within the openings. Furthermore, the curing is performed before patterning the openings. Moreover, the curing is performed after patterning the openings. Additionally, the solder is solder paste. Furthermore, the method further comprises reflowing the solder to form a solder bump. In an embodiment, removing the protective coating comprises attaching a peel tape to the protective coating and peeling the protective coating off of the wafer with the peel tape. Additionally, in an embodiment, disposing the protective coating is performed by solder paste printing (SPP). Moreover, in an embodiment, patterning openings within the protective coating is performed by laser ablation. Furthermore, in an embodiment, the laser ablation is performed with a 308 nm laser. In an embodiment, the wafer comprises a plurality of dies, wherein each die of the plurality of dies has a plurality of contacts. Additionally, in an embodiment, the wafer further comprises an encapsulant layer formed around the plurality of contacts.

In an embodiment, a protective coating comprises a base resin including a passivation stress buffer material and a loosening additive that decreases the adhesive strength of the base resin. In an embodiment, the passivation stress buffer material is polybenzoxazole (PBO). Additionally, in an embodiment, the passivation stress buffer material is a liquid crystal polymer (LCP). Furthermore, in an embodiment, the passivation stress buffer material is polynorbornenes (PNB). Moreover, in an embodiment, the passivation stress buffer material is polyphenylene sulfide (PPS). In an embodiment, the passivation stress buffer material is benzocylcobutene (BCB). Furthermore, in an embodiment, the passivation stress buffer material is polyimide (PI). Additionally, in an embodiment, the loosening additive is a monomeric surfactant. Moreover, in an embodiment, the monomeric surfactant is a material selected from the group consisting of fluorosurfactants and siloxanes. Furthermore, in an embodiment, the protective coating further comprises an additive selected from the group consisting of an elastomer, a photo pack, and a rigid particle filler. In an embodiment, the base resin has a tensile strength of at least 20 MPa. Additionally, in an embodiment, the base resin is resistant to temperatures greater than 270° C. Furthermore, in an embodiment, the protective coating has a pre-cure adhesive strength in the range of 500 mN/20 mm to 9000 mN/20 mm and a target post-cure adhesive strength in the range of 50 mN/20 mm to 400 mN/20 mm when adhered to silicon.

In utilizing the various aspects of this invention, it would become apparent to one skilled in the art that combinations or variations of the above embodiments are possible for forming a semiconductor device using dry-removable protective coatings. Although embodiments of the present invention have been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating embodiments of the present invention.

What is claimed is:

1. A method of protecting a surface, comprising:
disposing a protective coating on a surface of a substrate, the protective coating is composed of one layer that adheres to the surface, wherein the protective coating comprises an additive wherein the additive is a monomeric surfactant;
forming a plurality of openings in the protective coating to expose the surface of the substrate;
processing the surface of the substrate through the plurality of openings in the protective coating; and
removing the protective coating from the surface by separating the protective coating off of the surface without the use of chemical solutions.

2. The method of claim 1, wherein separating the protective coating is performed by peeling.

3. The method of claim 1, wherein the protective coating is resistant to temperatures greater than 120° C.

4. The method of claim 1, wherein the monomeric surfactant is a material selected from the group consisting of fluorosurfactants and siloxanes.

5. The method of claim 1, wherein disposing the protective coating comprises spinning on a wet solution and curing the wet solution.

6. The method of claim 1, wherein the substrate is a wafer.

7. A method of forming a structure on a semiconductor device, comprising:
disposing a protective coating on a wafer, the protective coating is composed of one layer that adheres to the wafer;
patterning openings within the protective coating that expose contacts on the wafer;
disposing solder within the openings; and
removing the protective coating from the wafer by separating the protective coating away from the wafer without the use of a chemical solution, leaving the material to remain as a patterned structure.

8. The method of claim 7, wherein removing the protective coating is performed after disposing solder within the openings.

9. The method of claim 7, further comprising curing the protective coating.

10. The method of claim 9, wherein the curing is performed before patterning the openings.

11. The method of claim 7, wherein the curing is performed after patterning the openings.

12. The method of claim 7, further comprising reflowing the solder to form a solder bump.

13. The method of claim 12, wherein removing the protective coating comprises:
attaching a peel tape to the protective coating; and
peeling the protective coating off of the wafer with the peel tape.

14. The method of claim 7, wherein disposing the protective coating is performed by solder paste printing (SPP).

15. The method of claim 7, wherein the wafer comprises a plurality of dies, wherein each die of the plurality of dies has a plurality of contacts.

16. The method of claim 15, further comprising an encapsulant layer formed around the plurality of contacts.

* * * * *